(12) United States Patent
Mikhailov

(10) Patent No.: US 9,496,060 B2
(45) Date of Patent: Nov. 15, 2016

(54) GRAPHENE-BASED NANODEVICES FOR TERAHERTZ ELECTRONICS

(71) Applicant: UNIVERSITÄT AUGSBURG, Augsburg (DE)

(72) Inventor: Sergey Mikhailov, Augsburg (DE)

(73) Assignee: UNIVERSITAET AUGSBURG, Augsburg (DE)

( * ) Notice: Subject to any disclaimer, the term of this patent is extended or adjusted under 35 U.S.C. 154(b) by 0 days.

(21) Appl. No.: 14/363,200

(22) PCT Filed: Nov. 9, 2012

(86) PCT No.: PCT/EP2012/072247
§ 371 (c)(1),
(2) Date: Jun. 5, 2014

(87) PCT Pub. No.: WO2013/083351
PCT Pub. Date: Jun. 13, 2013

(65) Prior Publication Data
US 2014/0319385 A1    Oct. 30, 2014

(30) Foreign Application Priority Data
Dec. 7, 2011   (EP) .................................. 11192457

(51) Int. Cl.
*G21G 4/06*         (2006.01)
*B82Y 20/00*       (2011.01)
(Continued)

(52) U.S. Cl.
CPC .............. *G21G 4/06* (2013.01); *B82Y 20/00* (2013.01); *H01L 29/0657* (2013.01);
(Continued)

(58) Field of Classification Search
CPC ............................. B82Y 20/00; G02F 2203/13
(Continued)

(56) References Cited

U.S. PATENT DOCUMENTS 8,554,022 B1 * 10/2013 Hochberg ......... H01L 29/66977
257/21
2006/0284539 A1 * 12/2006 Sung ........................... 313/311
(Continued)

FOREIGN PATENT DOCUMENTS

WO    2006/047975    5/2006

OTHER PUBLICATIONS

Ju et al., "Graphene plasmonics for tunable terahertz metamaterials", Nature Nanotechnology 6, 630-634 (2011).*
(Continued)

*Primary Examiner* — Jack Berman
*Assistant Examiner* — James Choi
(74) *Attorney, Agent, or Firm* — Paul D. Bianco; Gary S. Winer; Fleit Gibbons Gutman Bongini & Bianco PL

(57) ABSTRACT

The invention refers to a nanodevice for generating electromagnetic radiation in the terahertz frequency range, the nanodevice comprising a substrate (3) made of a dielectric material, a first graphene layer (1) arranged on the substrate (3), having a first longitudinal end being electrically connected with a source contact (source 1) and having a second longitudinal end being connected with a drain contact (drain 1), an electrically conducting layer (2) having a periodic grating structure with grating stripes (6) extending substantially in transversal direction (y), and a dielectric layer (4) arranged between the first graphene layer (1) and the conducting layer (2).

20 Claims, 7 Drawing Sheets

Figure 1:
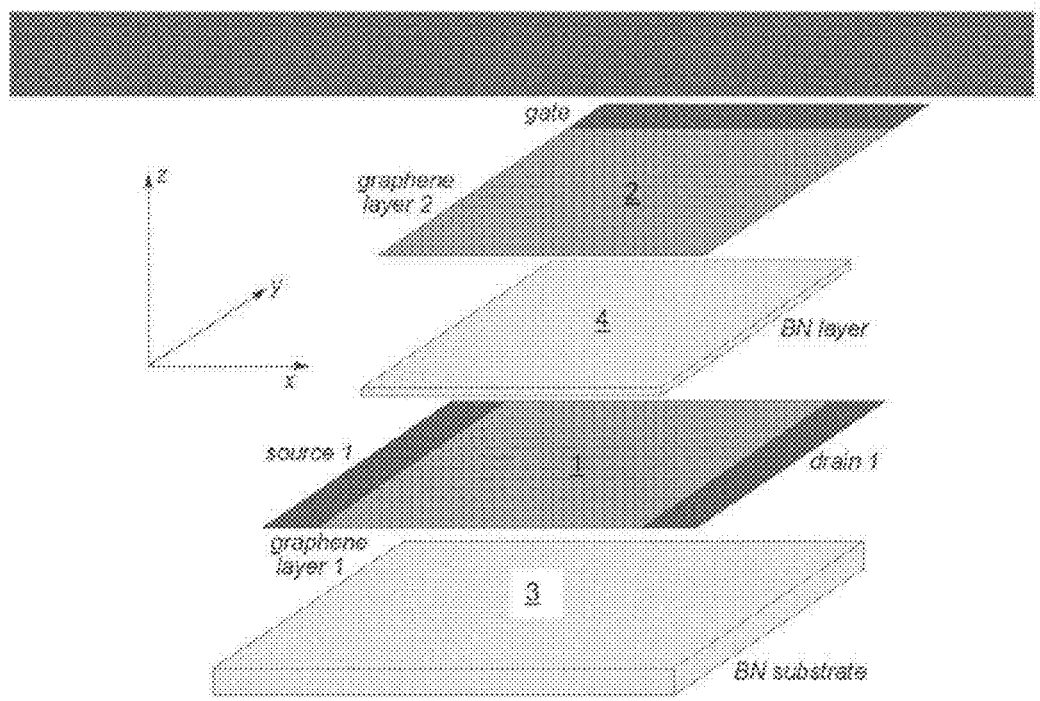

(51) Int. Cl.

| | | |
|---|---|---|
| *H01L 33/00* | (2010.01) | |
| *H01L 29/06* | (2006.01) | |
| *H01L 29/423* | (2006.01) | |
| *H01L 29/778* | (2006.01) | |
| *H01L 29/16* | (2006.01) | |
| *H01L 29/51* | (2006.01) | |

(52) U.S. Cl.
CPC ....... *H01L 29/1606* (2013.01); *H01L 29/4238* (2013.01); *H01L 29/778* (2013.01); *H01L 33/0041* (2013.01); *G02F 2202/36* (2013.01); *G02F 2203/13* (2013.01); *H01L 29/518* (2013.01)

(58) Field of Classification Search
USPC ...................................................... 257/20, 27
See application file for complete search history.

(56) References Cited

U.S. PATENT DOCUMENTS

| | | | | |
|---|---|---|---|---|
| 2007/0244012 A1* | 10/2007 | Welp | ...................... | H01L 39/225 505/190 |
| 2009/0225592 A1* | 9/2009 | Lau | .......................... | G11C 11/18 365/170 |
| 2009/0262766 A1* | 10/2009 | Chen | ...................... | H03C 7/027 372/26 |
| 2010/0200755 A1* | 8/2010 | Kawano | .................. | H01L 31/09 250/338.4 |
| 2011/0089404 A1* | 4/2011 | Marcus et al. | .................. | 257/29 |
| 2011/0204418 A1* | 8/2011 | Onishi | ................ | H01L 29/0692 257/194 |
| 2012/0248414 A1* | 10/2012 | Kim et al. | ....................... | 257/29 |
| 2013/0002520 A1* | 1/2013 | Choi | .................. | H01Q 15/0086 343/909 |
| 2013/0015375 A1* | 1/2013 | Avouris | .................... | G02B 6/10 250/504 R |
| 2013/0264748 A1* | 10/2013 | Lin | ..................... | C01B 31/0438 264/485 |
| 2013/0334402 A1* | 12/2013 | Izuha | .................... | H01L 27/146 250/208.1 |

OTHER PUBLICATIONS

Dragoman et al., "Terahertz antenna based on graphene", Journal of Applied Physics 107, 104313 (2010).*
Otsuji et al., "Emission of Terahertz Radiation from Two-Dimensional Electron Systems in Semiconductor Nano- and Hetero-Structures", J Infrared Milli Terahz Waves (2011) 32: 629-645.*
"Graphene-Based Periodic Gate Field Effect Transistor Structures for Terahertz Applications", Karabiyik et al., Nanoscience and Nanotechnology Letters vol. 5, 754-757, 2013.*
"Graphene-based Field-effect Transistor Structures for Terahertz Applications", Abbas et al., Terahertz Physics, Devices, and Systems VI: Advanced Applications in Industry and Defense, edited by A. F. Mehdi Anwar, Nibir K. Dhar, Thomas W. Crowe, Proc. of SPIE vol. 8363.*
"Graphene Plasmonics for Terahertz to Mid-Infrared Applications", Low et al., ACS Nano, vol. 8, No. 2, 2014.*
International Preliminary Report issued Jun. 10, 2014 for PCT/EP2012/072247.
Written Opinion published Jun. 7, 2014 for PCT/EP2012/072247.
Otsuji Taiichi et al.: "Grating-bicoupled plasmonresonant terahertz emitter fabricated with GaAs-based heterostructure material systems", Applied Physics Letters, AIP, Dec. 26, 2006.
Long Ju et al.: "Graphene plasmonics for tunable terahertz metamaterials", Nature Nanotechnology, vol. 6 No. 10, Jan. 1, 2011.
C. R. Dean et al.: "Boron nitride substrates for highquality graphene electronics", Nature Nanotechnology, vol. 5, No. 10, Oct. 1, 2010.
L. A. Ponomarenko et al.: "Tunable metalinsulator transition in double-layer graphene heterostructures", Nature Physics, vol. 7 No. 12, Jan. 1, 2011.
Keun Soo Kim et al.: "Large-scale pattern growth of graphene films for stretchable transparent electrodes", Nature International Weekly Journal of Science, vol. 457 No. 7230; pp. 706-710, Feb. 5, 2009.
Mikailov S A: "Plasma instability and amplification of electromagnetic waves in low-dimensional electron systems", vol. 58, No. 3, Jul. 15, 1998.
International Search Report for PCT/EP2012/72247 dated Feb. 21, 2013.
Written Opinion for PCT/EP2012/72247, Feb. 21, 2013.

* cited by examiner

GRAPHENE-BASED NANODEVICES FOR TERAHERTZ ELECTRONICS

TECHNICAL FIELD

The invention refers to graphene-based nanodevices, namely a voltage tunable generator of electromagnetic radiation and a transistor (amplifier) combined with a plane antenna, operating at terahertz frequencies.

BACKGROUND ART

The terahertz frequency range is usually defined as 0.1 to 10 THz. Terahertz waves are electromagnetic waves with frequencies higher than microwaves but lower than infrared radiation and visible light. This bandwith is known as the terahertz gap, because it proved to be difficult to produce suitable and small devices emitting electromagnetic radiation in this frequency range with enough power. Terahertz waves possess many advantages for different applications, as for example in spectroscopy, non-destructive testing of non-conductive materials such as plastics, foam, composites, ceramics, paper, wood and glass, e.g. in space industry, non-ionizing medical imaging and tumor detection, high resolution close range radar and security detection.

The radiation of a fast electron beam moving with a drift velocity $v_0$ is known as the Smith-Purcell effect, ([1] S. J. Smith and E. M. Purcell, Phys. Rev. 92, 1069(1953)). This phenomenon is used, for example, in vacuum microwave devices, but it has been never observed that solid-state structures can be used to emit terahertz radiation. Numerous attempts to build a solid-state terahertz emitter based on the same physical principle failed, see a discussion in Ref.[2] (S. A. Mikhailov, Phys. Rev. B 58, 1517 (1998)).

In recent years, graphene, which is an allotrope of carbon, has become the subject of theoretical and experimental studies, also in the field of electronic nanodevices. A technology needed for the production of Smith-Purcell-type graphene-based generators and amplifiers is already available. For example, a production of graphene layers on hexagonal boron nitride (h-BN) substrates is described in Ref.[3] (C. R. Dean, A. F. Young, I. Meric, C. Lee, L. Wang, S. Sorgenfrei, K. Watanabe, T. Taniguchi, P. Kim, K. L. Shepard, et al., Nature Nanotechnology (2010)). In Ref.[4] (L. A. Ponomarenko, A. K. Geim, A. A. Zhukov, R. Jalil, S. V. Morozov, K. S. Novoselov, I. V. Grigorieva, E. H. Hill, V. V. Cheianov, V. I. Falko, et al., Nature Physics (2011)) a layered structure BN-graphene-BN-graphene has been studied (with non-structured graphene layers). A system of narrow stripes in a single graphene layer with the stripe width from 4 µm down to 1 µm was prepared and investigated in Ref.[5] (L. Ju, B. Geng, J. Horng, C. Girit, M. Martin, Z. Hao, H. A. Bechtel, X. Liang, A. Zettl, Y. R. Shen, et al., Nature Nanotechnol. (2011), doi:10.1038/nnano.2011.146). Graphene layers of cm size have been produced in Ref.[6] (K. S. Kim, Y. Zhao, H. Jang, S. Y. Lee, J. M. Kim, K. S. Kim, J.-H. Ahn, P. Kim, J.-Y. Choi, and B. H. Hong, Nature 457, 706(2009).).

Technical Problem

It is an object of the invention to provide nanodevices for terahertz electronics covering the whole terahertz gap which are based on a simple device design for producing rather small and inexpensive nanodevices capable of emitting terahertz radiation with high power densities.

Technical Solution

These objects are solved with the nanodevices defined herein. Preferred embodiments of these nanodevices are also shown herein.

According to a first aspect of the invention, there is provided a nanodevice for generating electromagnetic radiation in the terahertz frequency range, the nanodevice comprising a substrate made of a dielectric material and defining a longitudinal (x) and a transversal (y) direction, a first graphene layer arranged on the substrate, having a first longitudinal end being electrically connected with a source contact and having a second longitudinal end being connected with a drain contact, an electrically conducting layer having a periodic grating structure with grating stripes extending substantially in transversal direction (y), and a dielectric layer arranged between the first graphene layer and the conducting layer.

In a preferred embodiment, the first graphene layer of the nanodevice according to the invention is a graphene monolayer structured as a periodic array of narrow stripes extending in longitudinal direction between the source contact and the drain contact, whereby the width ($W_y$) of the stripes of the first graphene layer in transversal direction (y) is substantially smaller than their length ($L_x$) in longitudinal direction (x). Preferably, the width ($W_y$) of the stripes in transversal direction (y) is smaller than 0.5 µm and in particular in the range of 0.1 µm-0.2 µm. The dielectric layer preferably is made of several monolayers of BN, in particular h-BN and typically has a thickness of several nm, for example between 1 and 30 nm.

The conducting layer preferably is a second layer of graphene, in particular a graphene monolayer. In a preferred embodiment, the conducting layer has a periodic grating structure with grating stripes extending substantially in transversal direction (y) and thus substantially perpendicular to the stripes of the first graphene layer, whereby the grating structure of the conducting layer (second graphene layer) has a grating period ($a_x$) in longitudinal direction (x) smaller than 0.5 µm and in particular in the range of 0.1 µm-0.2 µm. The conducting layer is connected in a first embodiment of the invention with a metallic gate contact or, in a second embodiment, with a second drain contact (drain 2) at one transversal end and with a second source contact (source 2) at its other transversal end.

In order to enhance the output intensity of the terahertz generator, a number of additional active graphene layers may be arranged between the dielectric layer and the conducting layer, whereby each of the graphene layers is separated by neighboring graphene layers by additional dielectric layers, which in particular can be some monolayers of h-BN.

The nanodevice according to the invention can be operated in two different operation modes. In a first operation mode, the nanodevice is a electromagnetic wave generator emitting terahertz radiation. In this operation mode, a large dc source-drain voltage ($V_{sd}$) is applied between the source contact and the drain contact of the first graphene layer and a small dc gate voltage ($V_{12}$) is applied between the source contact and the gate contact connected to the conducting layer, whereby the source-drain voltage ($V_{sd}$) is much larger than the gate voltage ($V_{12}$). In particular, the source-drain voltage ($V_{sd}$) is in the range of hundreds of volts to several kV and particularly about one Volt per grating period $a_x$, and the gate voltage ($V_{12}$) is in the order of several volts and preferably between 1 V and 10 V. In the second operation mode, the nanodevice can be operated as a transistor combined with a plane antenna. In this second operation mode, an ac voltage $V^{(1)}$ (t) oscillating with a frequency Ω is added to the dc gate voltage ($V_{12}$) thereby modulating the emitted radiation intensity with the frequency Ω of the ac signal, whereby the amplitude $V^{(1)}$ of the ac voltage is smaller than the dc gate voltage and that the oscillation frequency Ω of the ac voltage is much smaller than the frequency (2π f) of the terahertz radiation emitted by the nanodevice.

According to another aspect of the invention, there is provided a nanodevice for generating electromagnetic radiation in the terahertz frequency range, the nanodevice comprising a substrate made of a dielectric material,
a single graphene layer arranged on the substrate, having a first longitudinal end being electrically connected by a source contact and having a second longitudinal end being connected by a drain contact,
the single graphene layer being structured as a periodic array of narrow stripes extending in longitudinal direction (x) between the source contact and the drain contact,
whereby the narrow stripes have a periodically modulated width $W_y(x)$ in transversal direction.

The periodically modulated width $W_y(x)$ of the narrow stripes of the single graphene layer may be realized in a first embodiment of this aspect of the invention by lengthy and small stripes of graphene with a periodically alternating (modulated) width of the stripes in transversal direction, whereby the period of the modulated width is in the same order as their width, e.g smaller than 0.5 µm and in particular between 0.1-0.2 µm. In a second embodiment of this aspect of the invention, the periodically modulated width $W_y(x)$ of the narrow stripes of the single graphene layer may be realized by an array of holes, arranged regularly and like a lattice structure in the graphene layer, whereby the regular distance of neighbouring holes is preferably smaller than 0.5 µm and in particular in the range of 0.1-0.2 µm (in longitudinal direction x as well as in transversal direction y).

The operation principle of the proposed devices is based on the known physical effect that electrons, moving with an acceleration, radiate electromagnetic waves (Smith-Purcell effect, Ref.[1]). In the proposed devices electrons move in the working area (active layer of graphene), under the action of an applied source-drain voltage, with a rather high velocity of order of $v_0 \approx 10^8$ cm/s. The working area (active layer) is a specially designed one-atom-thick layer (monolayer) of graphene. Above the graphene monolayer there exists a thin conducting grating, which also can be made out of a specially designed graphene monolayer. A small dc voltage (one to a few Volt) is applied between the grating and the active graphene layer. This voltage induces a periodic potential $U(x)=U(x+a_x)$ in the plane of the active graphene layer (here $a_x$ is the grating period along the longitudinal direction x), so that the moving electrons($v_x \approx v_0$, $x \approx v_0 \cdot t$) experience a periodic in time force $F_x(t)=F_x(t+v_0 \cdot t/a_x)$. As a result, they get an oscillating contribution to their velocity, $$\delta v_x(t)=v_x(t)-v_0 \approx v_1 \cos(2\pi v_0 t/a_x)+\text{higher harmonics}. \quad (1)$$

This leads to an oscillating electric current in the plane of the active graphene layer, $$\delta j_x(t)=j_x(t)-j_0 \approx j_1 \cos(2\pi v_0 t/a_x)+\text{higher harmonics}, \quad (1)$$

and hence to the radiation of electromagnetic waves. The lowest-harmonic frequency of the radiated waves $$f=v_0/a_x \quad (3)$$

is determined by the dc drift velocity $v_0$ (which is controlled by the applied source-drain voltage) and by the grating period $a_x$. The higher-harmonics frequencies are multiples of the frequency f (3).

DETAILED DESCRIPTION OF EMBODIMENTS OF THE INVENTION

These and other aspects of the invention now will be described in detail for different embodiments of the invention with reference to the following drawings:

FIG. 1: The overall view of an embodiment for the design of a nanodevice according to the invention with a first graphene layer (graphene layer 1) lying on a BN substrate ("BN substrate") and being covered by a thin (few nm) dielectric layer made out of BN ("BN layer"). On top of the BN layer lies a second graphene layer (graphene layer 2). Two metallic contacts, "source1" and "drain1", are attached to the longitudinal ends of the first graphene layer (at the "west" and "east" sides). Another metallic contact ("gate") is attached to the second graphene layer 2 on one of its transversal ends (the "north" (or "south") side).

Figure 2:
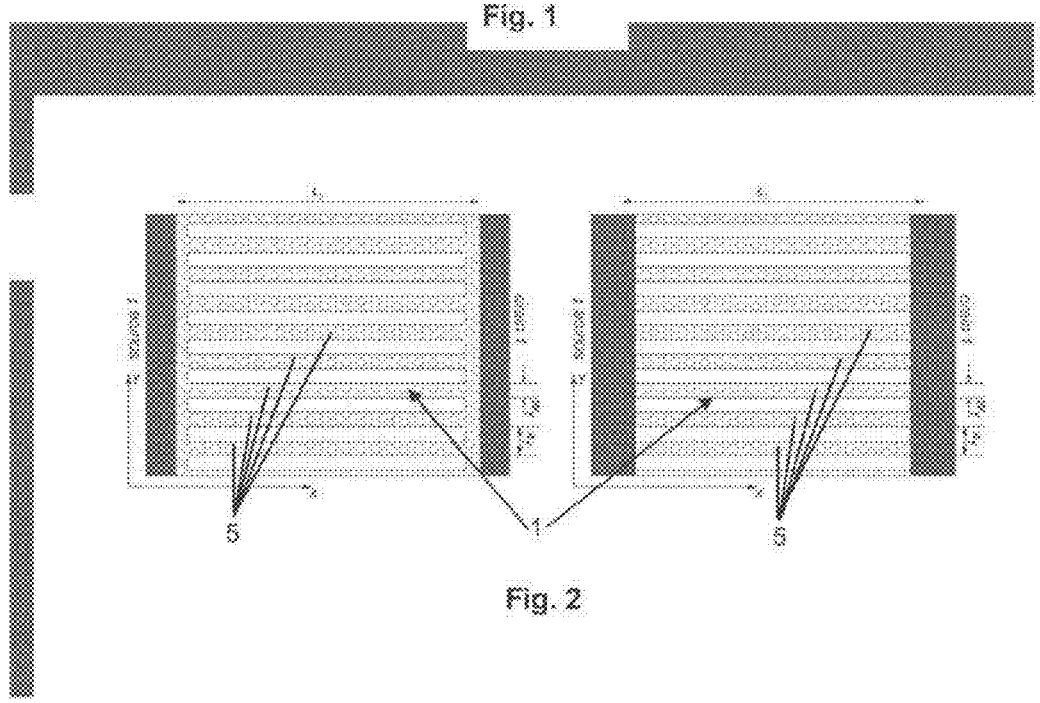

FIG. 2: The design of the first graphene layer of the device structure shown in FIG. 1. The central (operating) area of the first graphene layer is made in the form of a periodic array of narrow stripes (quantum wires). The width of the wires in transversal direction y is $W_y$, the period of the array is $a_y$. At its longitudinal ends, near the electrical contacts, the stripes can merge together (left panel of FIG. 2) or touch the contacts separately (right panel of FIG. 2).

Figure 3:
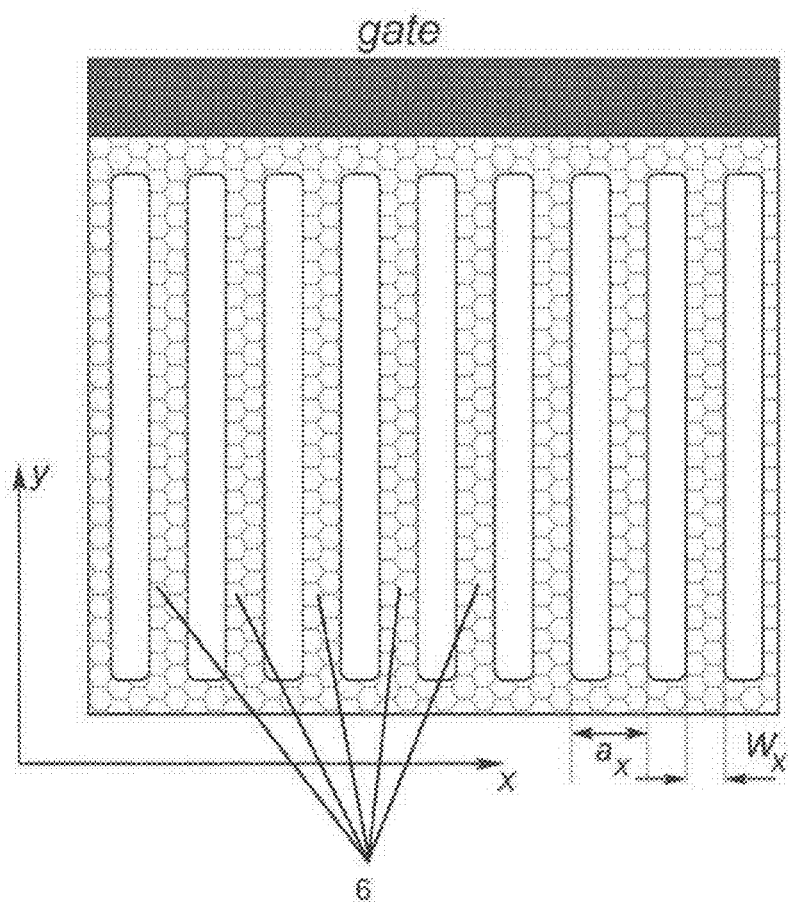

FIG. 3: The design of the second graphene layer of the device structure shown in FIG. 1. The central area of the layer consists in a periodic array (grating) of narrow stripes (wires). The width of the wires in longitudinal direction x is $W_x$, the period of the grating is $a_x$. A metallic contact (gate) is attached to the second graphene layer at one of its transversal ends. The near-contact area can be also made as in the right panel of FIG. 2.

Figure 4:
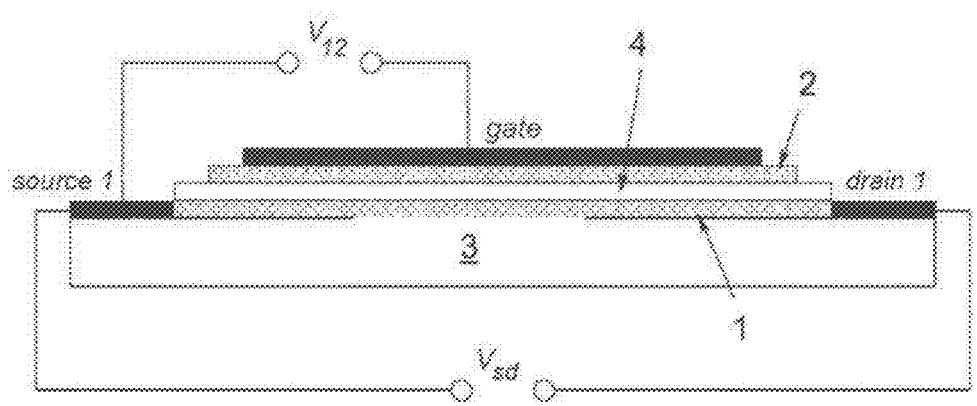

FIG. 4: Side view of one of the operation modes (generator mode) of the graphene-based nanodevice shown in FIG. 1.

Figure 5:
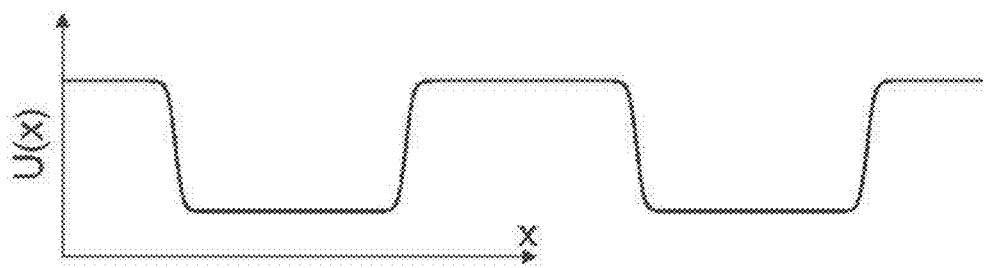

FIG. 5: Schematic view of the periodic potential U(x) in longitudinal direction x seen by the moving electrons. The potential U(x) is strongly non-sinusoidal and contains higher harmonics.

Figure 6:
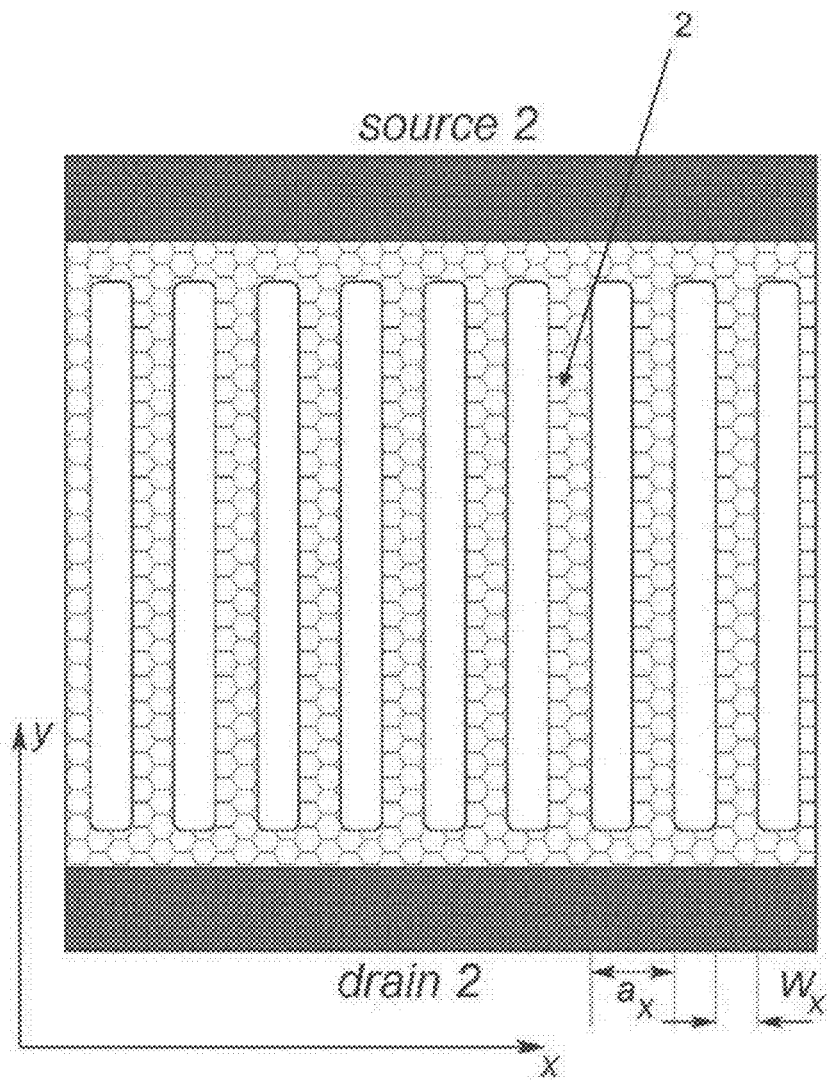

FIG. 6: An alternative design (symmetric design) of the second graphene layer of the nanodevice shown in FIG. 1. The second graphene layer has two metallic contacts (source 2 and drain 2) at their transversal ends which are used to carry an electric current in the second graphene layer in the transversal direction, which is perpendicular (or under another angle≠0) to the current in the first graphene layer induced by a voltage between its source and drain contacts. The near-contact areas of the second graphene layer can be also made as in the right panel of FIG. 2.

Figure 7:
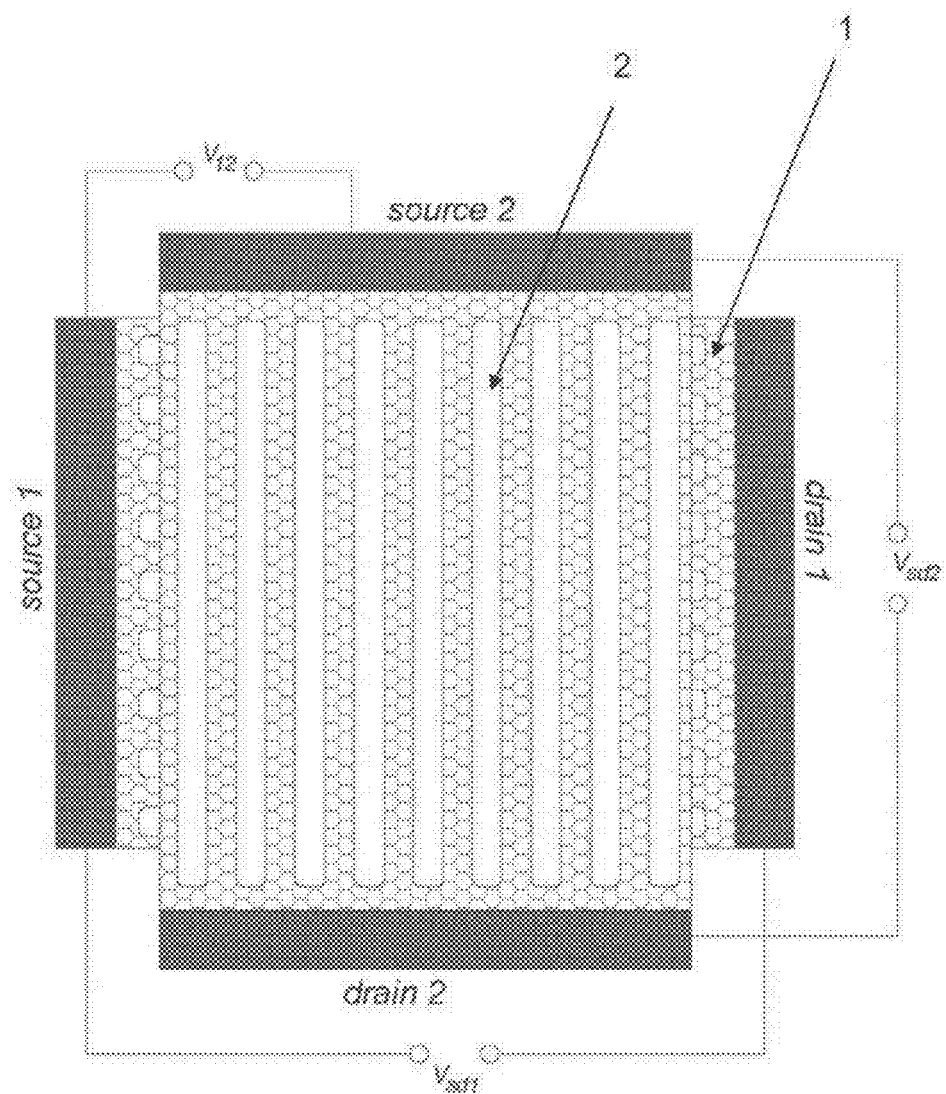

FIG. 7: Top view of one of the operation modes (generator mode) of the graphene-based nanodevice shown in FIG. 1 with the (symmetric) design of the second graphene layer shown in FIG. 6.

Figure 8:
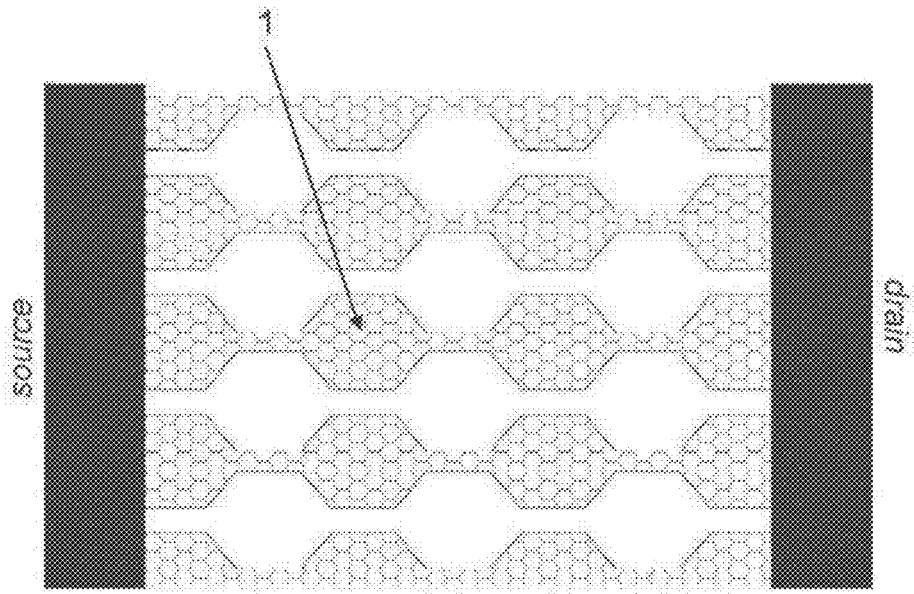

FIG. 8: A first embodiment of the nanodevice according to the second aspect of the invention having a one-layer graphene structure with a modulated width of stripes in the transversal direction y.

Figure 9:
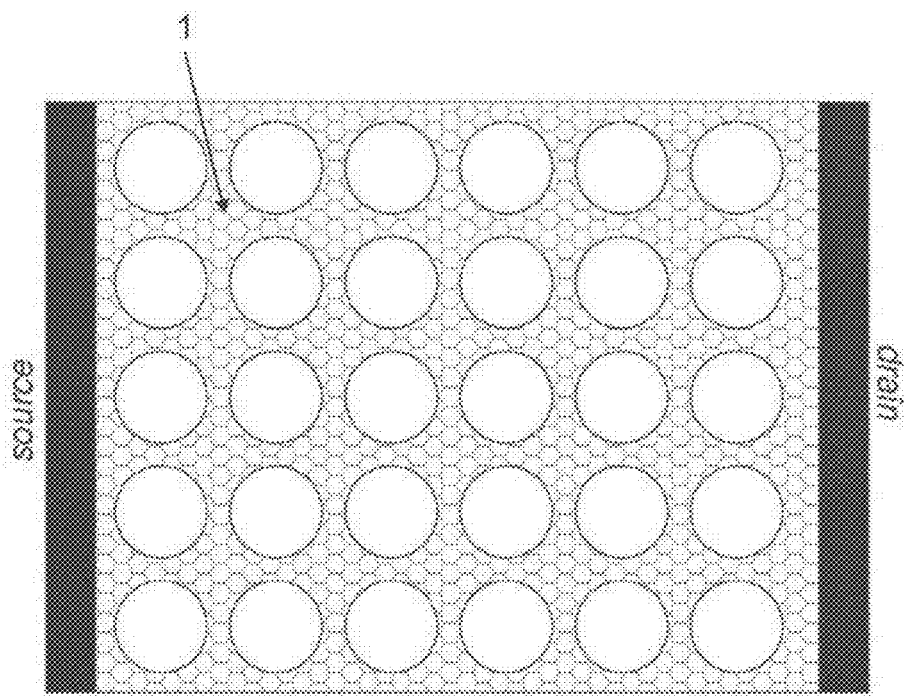

FIG. 9: A second embodiment of the nanodevice according to the second aspect of the invention having a one-layer graphene structure with an array of holes producing a modulation of the width of graphene stripes in the transversal direction y.

Figure 10:
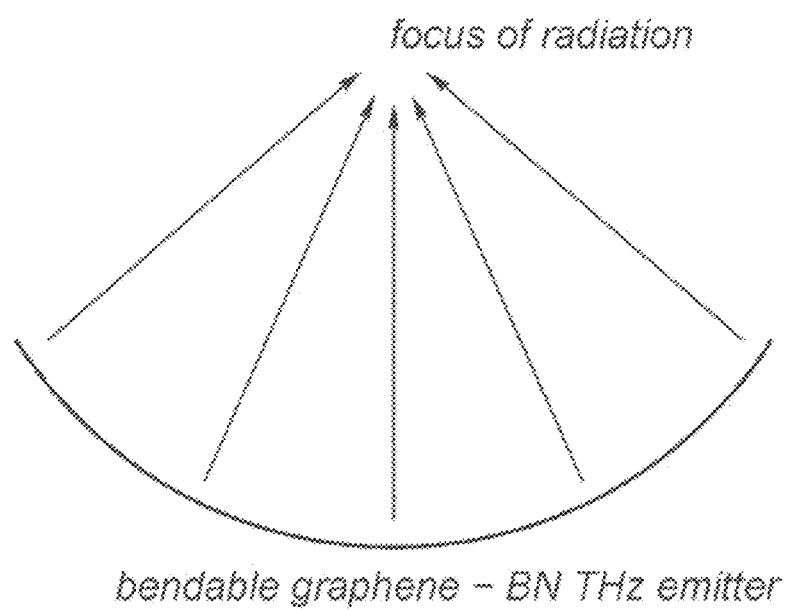

FIG. 10: Schematic illustration of a thin bended graphene-based nanodevice according to the invention focussing the emitted terahertz radiation to a focus of radiaton.

FIG. 1 shows a preferred embodiment of a basic design of the claimed nanodevice. The whole structure lies on a substrate 3 (marked as "BN substrate" in FIG. 1), which can be made out of any dielectric material, e.g. $SiO_2$ or SiC, but the best one would be the hexagonal (graphitic) boron nitride (h-BN). On the substrate lies a first graphene layer marked as "graphene layer 1" in FIG. 1. This layer is structured as shown in FIG. 2 and has two longitudinal ends connected with metallic contacts "source1" and "drain1", respectively. The first graphene layer 1 has the form of an array of narrow stripes 5, as shown in FIG. 2. The width $W_y$ of the stripes 5 in transversal direction y and the array period $a_y$ should be of order of 0.1-0.2 μm for the best device operation. Devices with larger values of $W_y$ and $a_y$, or even unstructured (without the array of stripes) also work (however only at temperatures below room temperature) but the best operation conditions are expected at $W_y \approx a_y/2 \approx 0.1$ μm or smaller.

Above the first graphene layer lies a thin dielectric layer 4 made out of a dielectric material, as for example several monolayers of h-BN. The thickness of this dielectric layer is about several nm. Above the dielectric (h-BN) layer lies a second thin conducting layer 2. The conducting layer 2 can be made out of metal, but the best way to do is to make it out of graphene, so that the conducting layer 2 is a second graphene layer. The conducting layer 2, in particular the second graphene layer, is structured as shown in FIG. 3 and has the shape of a grating with narrow grating stripes 6. On one of its transversal ends, the conducting layer 2 is electrically connected with a metallic contact "gate". The conducting layer 2 (second graphene layer) is arranged in respect to the first graphene layer 1 so that the grating stripes 6 of the conducting layer 2 are perpendicular to the stripes 5 of the first graphene layer 1. The angle between the two grating structures of the first graphene layer 1 and the conducting layer 2 (second graphene layer) may also differ from 90 degrees. The period $a_x$ of the grating in longitudinal direction x determines the upper boundary of the operating frequency range of the device, according to Eq. (3). For $a_x \approx 0.2$ μm e.g. this upper boundary is about 5 THz, 15 THz and 25 THz for the first, third and fifth harmonics of the operating frequency bands, respectively.

In the following, the operation principle of the device shown in FIG. 1 is explained: The role of the stripes 5 in the first graphene layer is manyfold:

1. It was shown in Ref.[2] that the Smith-Purcell radiation has a threshold: The device may emit radiation only if the drift velocity of electrons $v_0$ exceeds a certain threshold velocity $v_{th} \approx \omega_p a_x/2\pi$, $$v_0 > v_{th} \simeq \frac{\omega_p a_x}{2\pi}, \quad (4)$$

where $\omega_p$ is the frequency of two-dimensional plasma waves in the system. This condition, which imposes a restriction on the electron density $n_s$, is one of the most important for device operation.

It is an aspect of the invention that in graphene, the Fermi velocity $v_F$ is higher ($\approx 10^8$ m/s) than in semiconductor structures and electrons can be driven with the velocity close to $v_F$. Still the typical density of electrons in undoped graphene $n_s \approx 10^{11}$ cm$^{-2}$ is too high to satisfy the condition according to equation (4); the required value is about $10^{10}$ cm$^{-2}$. Making the active graphene layer 1 in the form of narrow stripes, one opens a gap in the spectrum of graphene electrons. The value of the gap depends on the stripe width. At $W_y \approx 0.1$ μm the gap is about 40 meV (almost 500K). Under these conditions, one can put the Fermi level inside the gap and get the density of about $10^{10}$ cm$^{-2}$ at room temperature. In structures with a larger width of the stripes, the gap is smaller. In such structures, in order to reduce the density (to satisfy the condition (4)) one needs to reduce the operating temperature. The Fermi level should lie inside the gap.

2. It is a further aspect of the invention that electrons and holes in graphene have a gapless spectrum with the linear energy dispersion and zero "rest mass". In the multiple-stripes system with the gap in the energy spectrum, the charge carriers are quasi-one-dimensional electrons with a finite "rest mass". The linear electron energy dispersion in the unstructured graphene leads to nonlinear effects in the electrodynamic response which may hinder the observation of the Smith-Purcell radiation. Restoring the gap and the finite "rest mass" in the system of graphene stripes, one avoids complications related to the nonlinear electromagnetic response of massless quasi-particles. In particular, for the plasma frequency of the striped system one can use the standard formula taken from the theory of conventional two-dimensional plasmons. On the other hand, the nonlinear electromagnetic phenomena (frequency multiplication, mixing) can play a positive role in the discussed device. Varying the stripe width in different samples, one can reduce or increase the role of the nonlinear electrodynamic effects and to choose the best operation regime, linear or nonlinear, depending on the requirements.

3. When a fast particle moves under the action of an additional periodic force it is its momentum that oscillates, not its velocity: e.g $$\frac{d p_x}{d t} = F(t) = F_0 \cos \omega t, \quad (5)$$

$$p_x(t) = p_0 + \frac{F_0}{\omega} \sin \omega t.$$

If the spectrum of electrons is linear, $E_p = v_F |p_x|, v_x(p_x) = v_F \operatorname{sgn} p_x,$ the oscillations of the momentum do not lead to the oscillations of the velocity, hence do not lead to the oscillations of the current, and hence do not lead to radiation. If the electron spectrum has a gap, $$E_p = \sqrt{\Delta^2 + v_F^2 p_x^2},$$

$$v_x(p_x) = \frac{v_F^2 p_x}{\sqrt{\Delta^2 + v_F^2 p_x^2}},$$

the momentum oscillations do lead to the velocity oscillations and hence to the current oscillations. The gap in the electronic spectrum is therefore vitally important for the emission of radiation.

From this consideration it is seen that the dc drift velocity should not be too high (should not be close to $v_F$). The optimum value of $v_0$ is about 50-70% of the Fermi velocity, i.e. (5-7)×$10^7$ cm/s, which is easier to realize experimentally.

The periodically arranged stripes 6 in the conducting layer 2 serve as a grating to couple the oscillating electrons in the structure to the external electromagnetic radiation.

In the operation mode shown in FIG. 4, a large dc voltage $V_{sd}$ is applied between the source and drain contacts (hundreds of Volts or several kV) and a small dc voltage is applied between source and gate contacts (several Volts). Preferably, the source-drain voltage $V_{sd}$ is adapted to the grating period in the x-direction $a_x$ and is in the range of 1 Volt per grating period $a_x$. The source-drain voltage $V_{sd}$ causes a strong dc current $j_0$ in the stripes 5 of the first graphene layer 1 in the x-direction (longitudinal direction). The source-drain voltage $V_{sd}$ should provide the drift velocity of electrons $v_0$ to be close to the saturation velocity $v_F \simeq 10^8$ cm/s). The gate voltage $V_{12}$ produces a periodic potential U(x) acting on the electrons of the beam. The value of $eV_{12}$ should be of order of or around the gap value. Since the width of the grating stripes ($\simeq$0.1 μm) is much larger than the distance between the layers (several nm), the potential U(x) has a step-like form and therefore contains higher spatial harmonics, shown in FIG. 5. The induced ac current $j_1(t)$ then contains many higher frequency harmonics. The intensity of radiation is proportional to the squared ac-component of the current $I \propto j_1^2$.

If the velocities $v_0$ and $v_1$ in Eq. (1) are of order of $10^8$ cm/s and the average areal density of electrons $n_s$ is about $10^{10}$ cm$^{-2}$, the estimated emitted power of the device is about 0.5 W/cm$^2$. The efficiency η (the ratio of the radiated power to the Joule heat) is of order of 1%. The emitted radiation is polarized in the x direction. If the width of the stripes 5 in the active layer is of order of $W_y \simeq$0.1 μm the operating temperature of the device can be close to room temperature. The estimated heating of the device by the strong dc current is not very large because of the large thermal conductivity of the dielectric (h-BN) substrate and the extremely large surface-to-volume ratio in the active graphene monolayer (first graphene layer 1). The average electron density $n_s$ should not substantially exceed (1-10)× $10^{10}$ cm$^{-2}$, due to the threshold-velocity reason discussed above. For the best operation the linear dimensions of the device in longitudinal and transversal direction (Lx, Ly) should be larger than the radiation wavelength λ (e.g. λ=0.3 mm at f=1 THz), but the smaller devices will also emit radiation (as a point dipole, if Lx,Ly<<λ).

By using more than one active graphene layers under the grating structure of the conducting layer 2 (separated by thin dielectric layers, for example of h-BN) one can increase the total power of radiation by a factor of $N^2$, where N is the number of active layers (graphene layers). The same goal can be achieved by using bilayer or few-layer graphene as active layer. The total density of electrons should, however, be not much larger than a few units times $10^{10}$ cm$^{-2}$ since the plasma frequency in equation (4) is determined by the total two-dimensional electron density.

In addition to the above described asymmetric-layers design one can use a symmetric design shown in FIG. 6. In this case the conducting layer 2 (second graphene layer) also has two contacts ("source 2" and "drain 2") instead of one gate contact. The first graphene layer and the conducting layer 2 (second graphene layer) are actually symmetric but rotated with respect to each other by α=90° (the angle α may differ from 90 degrees). In the alternative operation mode shown in FIG. 7, a source-drain voltage $V_{sd1}$ is applied between the source and drain contacts of the first graphene layers 1 and source-drain voltage $V_{sd2}$ is applied between the source and drain contacts of the conducting layer 2 (second graphene layer). Hence, the current flows in the first graphene layer 1 in the x-direction (longitudinal direction, between contacts "source 1" and "drain 1") and in the conducting layer 2 (second graphene layer) the current flows in the y-direction (transversal direction). A gate voltage $V_{12}$ is applied in this case between the first graphene layer and the conducting layer 2 (second graphene layer), so that each layer serves as a grating for its neighbor. This symmetric-design device emits radiation polarized both in the x- and y-directions, with the power and frequency separately controlled by the source-drain voltages $V_{sd1}$ and $V_{sd2}$ in each layer.

Possible embodiments according to the second aspect of the invention are shown in FIGS. 8 and 9, and employ a single layer of graphene structured with narrow stripes having a modulated width, as shown in FIG. 8. In an alternative embodiment of the second aspect of the invention, the device comprises a single layer of graphene with a regular array of holes, arranged in a lattice-like structure, as shown in FIG. 9 whereby the regular distance of neighbouring holes is preferrably in the range of 0.1-0.2 μm (in longitudinal direction x as well as in transversal direction y). In this structure, the conducting channels in the single graphene layer also have a modulated width. The modulated width of the stripes $W_y$ (x) is in a preferred embodiment in the range of 0.1-0.2 μm and leads to an x-dependent gap and hence to an effective periodic potential U(x) acting on the moving electrons. An advantage of such a scheme is that one needs only one (active) graphene layer. A disadvantage of such a scheme is, however, the absence of higher harmonics, since the effective potential will be smooth and not so strongly non-sinusoidal as shown in FIG. 5.

The basic design of the device emitting terahertz radiation explained above and shown in the Figures can also be used as a transistor (amplifier) combined with a plane antenna. Since the intensity of the emitted signal is determined by the gate voltage $V_{12}$, adding a small ac signal (in the frequency range of order of Ω<<2π f, e.g. the frequency range of voice or music) to the gate voltage $V_{12}$, $$V_{12}=V^{(0)}+V^{(1)} \cos \Omega t, \quad (6)$$

results in the modulation of the emitted radiation intensity with the frequency of the amplified signal Ω. The signal Ω is amplified and sent directly to the surrounding space within the same physical process, so that the device according to the invention can be used as a new type of transistor (amplifier) combined with a radiating antenna and working at THz frequencies.

Modern technology allows to realize each of the required component of the device according to the invention, see Ref.[3]-Ref.[6]. The grating structures in the graphene layer(s) can be produced by standard etching techniques or laser annealing.

As mentioned above, preferable dimensions of the array of stripes $a_y$ in the transversal direction and of the grating period $a_x$ in the longitudinal direction are in the range of 0.1-0.2 microns. Actually, these numbers are given as a preferred example only. The lower boundary (0.1 μm) is realistic to be built in graphene structures with present technologies (even 0.08 μm seems presently possible). If in future, however, experimental technology in graphene systems will improve to be able to produce even smaller-scale structures, this may also be used in the devices of the invention. The upper number for the structural dimensions mentioned above (0.2 µm) can be higher, if a different operating frequency is wanted, since the grating period $a_x$ actually determines the operating frequency (the higher the grating period $a_x$, the lower is the operating frequency f of the device, Equation 1). The dimension in the transversal direction $a_y$ is related to the operating temperature: the higher $a_y$, the lower should be the operating temperature. Therefore, the dimensions of the structures in longitudinal and transversal direction, $a_x$ and $a_y$, can be choosen outside the preferred range of 0.1-0.2 µm, if appropriate.

The proposed graphene based nanodevices may cause a revolution in the communication and imaging technique and other areas: First, they promise to cover the whole terahertz gap (the frequency range between ≃0.1 and 10 THz) by simple and relatively inexpensive basic devices—generators and amplifiers. Second, the estimated radiation power of ≃0.5 W/cm$^2$ is very high for the device with the thickness of several nanometers. The area of 1 m covered by such devices would emit 5 kW of THz radiation. Third, both graphene and h-BN layers absorb only a few percent of visible-light radiation and are almost transparent for visible light. Such flat, two-dimensional powerful terahertz devices will be practically invisible. Fourth, such few-nm thick generators and amplifiers are flexible and can be bent for focusing the radiation in a focus and producing a huge concentration of THz power in very small spatial volumes, as shown in FIG. 10.

The invention claimed is:

1. A nanodevice for generating electromagnetic radiation in a terahertz frequency range, comprising:
   a substrate made of a dielectric material;
   a source contact and a drain contact;
   a first graphene layer arranged on the substrate and extending in a longitudinal direction between a first longitudinal end electrically connected with the source contact and a second longitudinal end connected with the drain contact;
   a dielectric layer arranged on or covering the first graphene layer; and
   an electrically conducting layer arranged on the dielectric layer forming a grating structure of an array of periodic stripes having a predetermined width and a predetermined mutual separation, the grating length extending substantially in a transversal direction between a first and second transversal end, the transversal direction orthogonal to the longitudinal direction, wherein the electrically conducting layer is connected with a metallic gate contact at one of its transversal ends;
   wherein the first graphene layer and the electrically conducting layer are cooperative to generate electromagnetic radiation in the terahertz frequency range when a direct current (dc) voltage is applied between the source contact and the drain contact, and a smaller direct current (dc) voltage is applied between the source contact and the gate contact, whereby the grating structure of the electrically conducting layer serves for coupling the electromagnetic radiation generated out of the nanodevice.

2. The nanodevice according to claim 1, wherein the first graphene layer is structured as a periodic array of narrow stripes extending the longitudinal direction between the source contact and the drain contact.

3. The nanodevice according to claim 2, wherein width of the stripes of the first graphene layer in transversal direction is smaller than their length in the longitudinal direction.

4. The nanodevice according to claim 1, wherein the width of the periodic stripes in a transversal direction is smaller than 0.5 µm.

5. The nanodevice according to claim 1, wherein the dielectric layer is made of several monolayers of boron nitride (BN).

6. The nanodevice according to claim 1, wherein the electrically conducting layer is a second graphene layer.

7. The nanodevice according to claim 2, wherein the electrically conducting layer has a periodic grating structure with grating stripes extending substantially in a transversal direction and substantially perpendicular to the stripes of the first graphene layer.

8. The nanodevice according to claim 7, wherein the grating structure of the electrically conducting layer has a grating period in a longitudinal direction smaller than 0.5 µm.

9. The nanodevice according to claim 1, wherein the electrically conducting layer is connected with a metallic gate contact or with a second drain contact at one transversal end and with a second source contact at its other transversal end.

10. The nanodevice according to claim 1, wherein a number of additional graphene layers is arranged between the dielectric layer and the electrically conducting layer, whereby each of the additional graphene layers is separated from neighboring graphene layers by additional dielectric layers.

11. A method for generating an emission of terahertz radiation, comprising:
    using a nanodevice according to claim 1 by:
    applying a dc source-drain voltage between the source contact and the drain contact; and
    applying a dc gate-voltage between the source contact and the gate contact, wherein the source-drain voltage is much larger than the gate voltage;
    thereby causing the nanodevice to generate terahertz radiation which is coupled out of the nanodevice by the grating structure of the electrically conducting layer.

12. The method according to claim 11, wherein the source-drain voltage is in a range of hundreds of volts to several kV and the gate voltage is in an order of several volts.

13. The method according to claim 11, further comprising:
    adding an ac voltage signal oscillating with a frequency to the dc gate voltage thereby modulating an intensity of the emitted radiation with the frequency of the ac voltage signal;
    whereby the nanodevice functions as a transistor.

14. The method according to claim 13, wherein amplitude of the ac voltage signal is smaller than the dc gate voltage and wherein oscillation frequency of the ac voltage is much smaller than frequency of the terahertz radiation emitted by the nanodevice.

15. A device for generating electromagnetic radiation, comprising:
    a substrate made of a dielectric material,
    a source contact and a drain contact,
    a single graphene layer arranged on the substrate and having a first longitudinal end electrically connected with the source contact and a second longitudinal end connected with the drain contact, the single graphene layer forming a regular periodic array of narrow stripes, each stripe extending in the longitudinal direction between the source contact and the drain contact, the narrow stripes having a periodically modulated regular width as measured in a direction orthogonal to the longitudinal direction, the single graphene layer thereby configured to generate radiation in the terahertz frequency range when a dc voltage is applied between the source and drain contacts, wherein modulation of width of the narrow stripes serves for coupling the electromagnetic radiation out of the device.

16. A method for generating radiation, comprising:

using a device including:

a substrate made of a dielectric material;

a source contract and a drain contact;

a first graphene layer arranged on the substrate and extending in a longitudinal direction between a first longitudinal end being electrically connected with the source contact and a second longitudinal end being connected with the drain contact;

a dielectric layer arranged on or covering the graphene layer; and an electrically conducting layer arranged on the dielectric layer, extending coplanar to the first graphene layer and in a transversal direction between a first and second transversal end, the transversal direction orthogonal to the longitudinal direction, and forming a grating structure of an array of stripes, each stripe extending in the transversal direction, and having a grating period of between 0.1 and 0.5 micrometers, wherein the electrically conducting layer is connected with a metallic gate contact at one of its transversal ends;

applying a dc source drain voltage between the source contact and the drain contact; and applying a gate voltage between the source contact and the drain contact to generate electromagnetic radiation in a terahertz frequency range, which is coupled out of the nanodevice by the grating structure of the electrically conducting layer.

17. The method of claim 16, further comprising applying an ac voltage signal to the electrically conducting layer, thereby modulating an intensity of generated radiation with frequency of the ac voltage signal.

18. The method of claim 16, wherein the electrically conducting layer of the device used is a second graphene layer.

19. The nanodevice according to claim 8, wherein the grating period in the longitudinal direction has a range of 0.1 μm-0.2 μm.

20. The method according to claim 12, wherein the gate voltage has a range between 1 V and 10 V.

* * * * *